(12) United States Patent
Hsin et al.

(10) Patent No.: US 8,004,602 B2
(45) Date of Patent: Aug. 23, 2011

(54) IMAGE SENSOR STRUCTURE AND INTEGRATED LENS MODULE THEREOF

(75) Inventors: Chung-Hsien Hsin, Hsinchu (TW); Chun-Hua Chuang, Hukou Township, Hsinchu County (TW); Chen-pin Peng, Beipu Township, Hsinchu County (TW); Chien-Wei Chang, Sinpu Township, Hsinchu County (TW); Chien-Hen Lin, Yangmei Township, Taoyuan County (TW)

(73) Assignee: Kingpak Technology Inc., Hsin Chu Hsien (TW)

( * ) Notice: Subject to any disclaimer, the term of this patent is extended or adjusted under 35 U.S.C. 154(b) by 629 days.

(21) Appl. No.: 12/153,350

(22) Filed: May 16, 2008

(65) Prior Publication Data
US 2009/0283809 A1 Nov. 19, 2009

(51) Int. Cl.
*H04N 5/225* (2006.01)
(52) U.S. Cl. .................... 348/373; 348/374
(58) Field of Classification Search .......... 348/373–376; 257/294, 459, E23.001, 21.499, E23.02; 250/208.1, 239; 396/529, 532
See application file for complete search history.

(56) References Cited

U.S. PATENT DOCUMENTS

| | | | |
|---|---|---|---|
| 7,088,397 B1* | 8/2006 | Hunter et al. | 348/374 |
| 2006/0132644 A1* | 6/2006 | Shangguan et al. | 348/374 |
| 2007/0210246 A1* | 9/2007 | Ellenberger et al. | 250/239 |
| 2007/0216028 A1* | 9/2007 | Lee et al. | 257/738 |
| 2007/0248355 A1* | 10/2007 | Lee | 396/529 |
| 2007/0264002 A1* | 11/2007 | Lee | 396/275 |
| 2008/0191335 A1* | 8/2008 | Yang et al. | 257/680 |
| 2009/0014826 A1* | 1/2009 | Chien et al. | 257/433 |

* cited by examiner

*Primary Examiner* — Lin Ye
*Assistant Examiner* — Euel Cowan
(74) *Attorney, Agent, or Firm* — Stites & Harbison PLLC; Juan Carlos A. Marquez, Esq.

(57) ABSTRACT

An image sensor structure and an integrated lens module thereof are provided. In the image sensor structure with the integrated lens module, the image sensor structure comprises a chip and a lens module. The chip has light-sensing elements, first conducting pads, and a conducting channel. The light-sensing elements are electrically connected to the first conducting pads and the first conducting pads are electrically connected to one end of the conducting channel passing through the chip. The lens module comprises a holder and at least one lens. The holder has a through hole and the lens is embedded in the through hole and integrated with the holder. By using the integrated lens and holder, a manufacturing process of the image sensor structure is simplified and a manufacturing cost of the image sensor structure is reduced.

15 Claims, 5 Drawing Sheets

IMAGE SENSOR STRUCTURE AND INTEGRATED LENS MODULE THEREOF

BACKGROUND OF THE INVENTION

1. Technical Field

The present invention relates to an image sensor structure and an integrated lens module thereof. More particularly, the present invention relates to an image sensor structure and an integrated lens module thereof wherein the integrated lens module facilitates simplifying a manufacturing process of the image sensor structure.

2. Description of Related Art

With the development and popularization of various digital image products, a market demand for image sensor modules for being applied to these digital image products, such as digital cameras, camera phones, video phones, fingerprint readers, and so on, have been gradually increased. For economically satisfying the demands from low-end digital image products that require less in image sensing sensitivity, it is necessary to simplify a manufacturing process of image sensors so as to reduce a manufacturing cost of image sensors.

FIG. 1 is a sectional view of a conventional image sensor structure 10. Therein, the conventional image sensor structure 10 comprises a substrate 11, a chip 12, a lens seat 13, and a lens barrel 14. The substrate 11 has a plurality of metal wires 111 and a plurality of metal balls 112, wherein the metal wires 111 are electrically connected to the metal balls 112. The chip 12 is settled on the substrate 11 and includes a light-sensing element 121 thereon. Moreover, the chip 12 is electrically connected to the metal wires 111 on the substrate 11 by means of wire-bonding. The lens seat 13 is formed with an inner threaded portion 131 and is settled on the substrate 11 so that a closed space 15 is defined between the lens seat 13 and the substrate 11 for accommodating the chip 12. Besides, the lens barrel 14, having an outer threaded portion 142 that fittingly engages with the inner threaded portion 131 of the lens seat 13, is combined therein with at least one lens 141.

Thereby, when light passes through the lens 141 and reaches the light-sensing element 121 on the chip 12, the light-sensing element 121, in response to the light, converts the light into an electrical signal. At this time, since the chip 12 is electrically connected to the metal wires 111 on the substrate 11 by means of wire-bonding while the metal wires 111 are electrically connected to the metal balls 112 that can be further electrically connected to an external circuit (not shown), a channel for transmitting the electrical signal generated by the light-sensing element 121 is formed. Besides, for better focusing the light on the light-sensing element 121 on the chip 12, the lens barrel 14 may be rotated to have its vertical position adjusted and in turn achieve a more desirable image focal distance between the lens 141 and the chip 12 so as to enhance an imaging effect of the image sensor structure 10.

In a practical manufacturing process of the image sensor structure 10, a relative distance between the lens barrel 14 and the lens 141 has to be set in each said image sensor structure 10, respectively and then the imaging effect of each said image sensor structure 10 has to be checked respectively. Consequently, the complexity of the conventional manufacturing process can significantly reduce a production yield yet increase a manufacturing cost of the image sensor structure 10. Thus, the image sensor structure 10 inherently fails to meet an economic requirement of low-end digital image products. In addition, while the wire-bonding takes up a substantial area in the closed space 15 defined between the lens seat 13 and the substrate 11, an overall size of the packaged image sensor structure 10 can not be significantly reduced and thus the image sensor structure 10 is unfit for the modern digital image products tending towards miniaturization.

SUMMARY OF THE INVENTION

The present invention provides an image sensor structure and an integrated lens module thereof. By using the integrated lens module to assemble the image sensor structure, a procedure for setting a relative distance between a lens and a chip can be simplified, so that a manufacturing process of the image sensor structure can be consequently simplified. Besides, the integrated lens module also facilitates reducing elements required in the image sensor structure and thereby decreasing a manufacturing cost of the image sensor structure. Moreover, by implementing the chip having a conducting channel, which can be electrically connected to an external circuit without the means of wire-bonding, the packaged image sensor structure 10 can be downsized.

To achieve the above ends, the disclosed image sensor structure with the integrated lens module comprises a chip having a plurality of light-sensing elements arranged on a light-sensing area of a first surface of the chip, a plurality of first conducting pads electrically connected to the light-sensing elements, and at least one conducting channel passing through the chip and electrically connected to the first conducting pads at one end, and a lens module comprising a holder having a through hole and a contact surface on a bottom of the holder, wherein the contact surface is combined with the first surface; and at least one lens embedded in the through hole and integrated with the holder.

To achieve the above ends, the disclosed integrated lens module comprises a holder having a through hole, and at least one lens embedded in the through hole and integrated with the holder.

By implementing the present invention, at least the following progressive effects are expected to be achieved:

1. A manufacturing process of an image sensor can be simplified;
2. A manufacturing cost of an image sensor can be decreased; and
3. An overall volume of a packaged image sensor can be reduced.

BRIEF DESCRIPTION OF THE DRAWINGS

The invention as well as a preferred mode of use, further objectives and advantages thereof, will best be understood by reference to the following detailed description of an illustrative embodiment when read in conjunction with the accompanying drawings, wherein.

DETAILED DESCRIPTION OF THE PREFERRED EMBODIMENT

Figure 1:
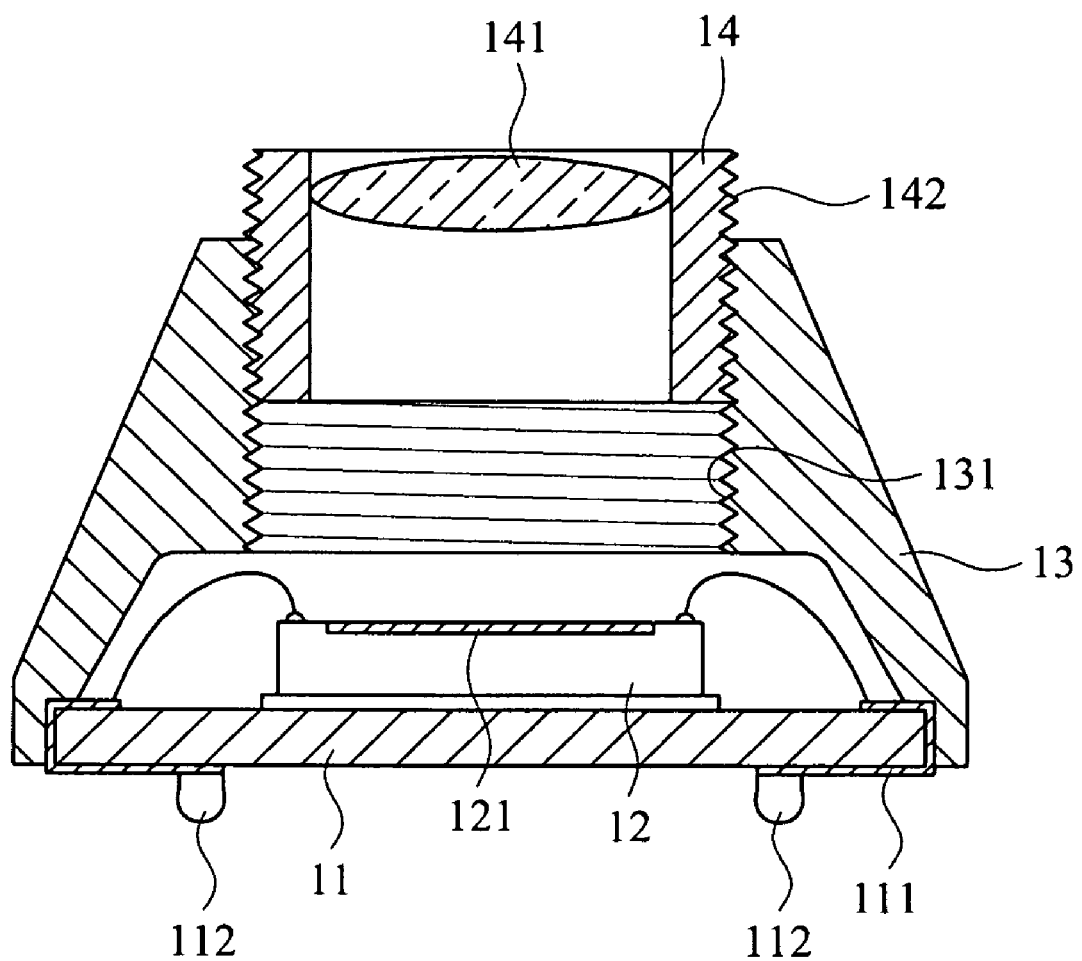
FIG. 1 is a sectional view of a conventional image sensor structure.
Figure 2:
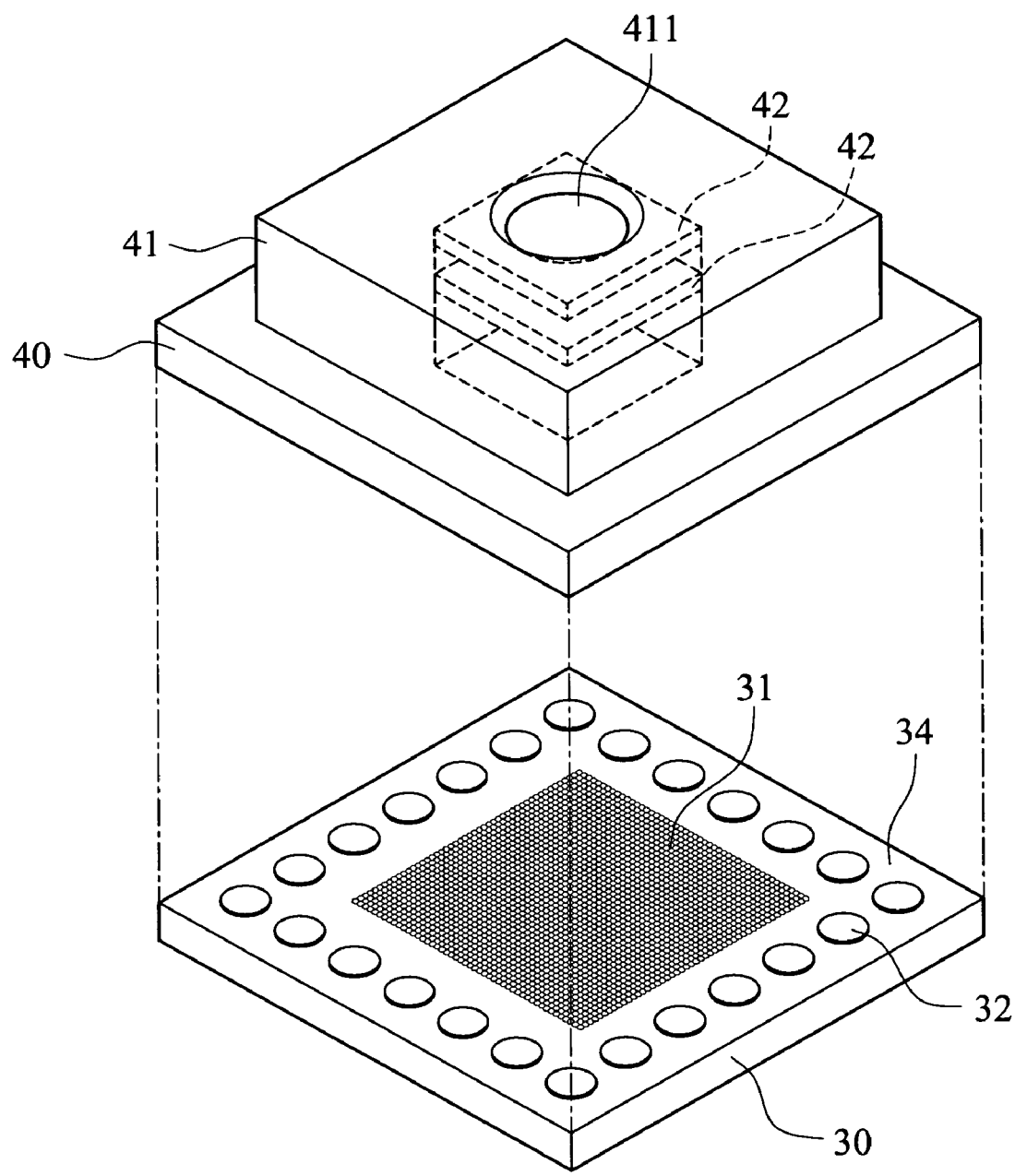
FIG. 2 is a schematic drawing illustrating an image sensor structure with an integrated lens module according to a first embodiment of the present invention.

As shown in FIG. 2, the image sensor structure 20 with the integrated lens module comprises a chip 30 and a lens module 40.

Figure 3:
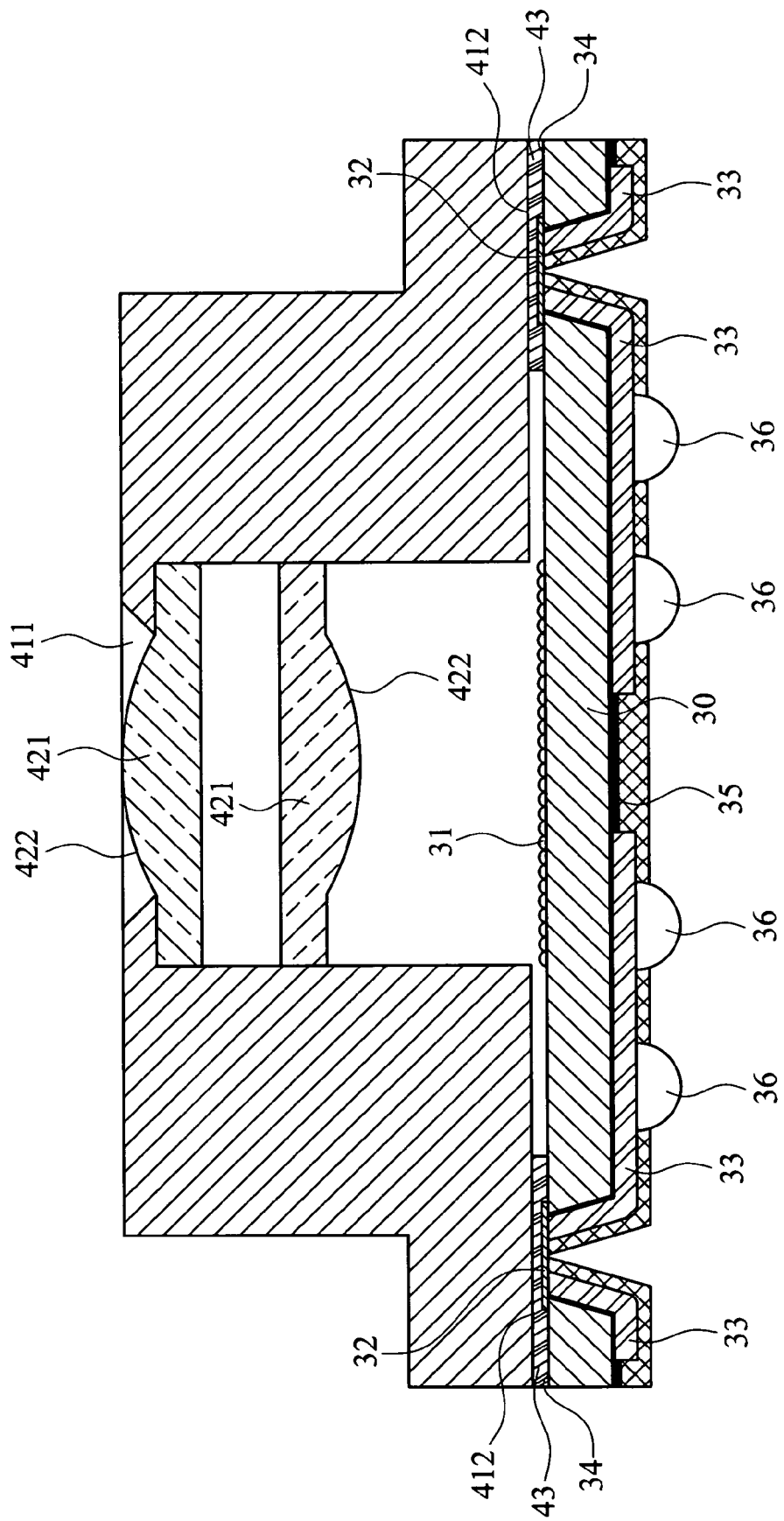
FIG. 3 is a cross-sectional view of the image sensor structure with the integrated lens module according to the first embodiment of the present invention.

The chip 30 may be a complementary metal oxide semiconductor (CMOS) image sensor chip. As shown in FIG. 3, the chip 30 has a plurality of light-sensing elements 31, a plurality of first conducting pads 32, and at least one conducting channel 33.

The light-sensing elements 31 are arranged on a light-sensing area of a first surface 34, namely a top surface, of the chip 30 and serve to sense light entering the image sensor structure 20. Then the light-sensing element 31, in response to the light, converts the light into an electrical signal. The first conducting pads 32 are electrically connected to the light-sensing elements 31 and arranged around the light-sensing area of the chip 30. The conducting channel 33 passes through the chip 30 so that one end thereof reveals at a second surface 35 of the chip 30, namely a bottom surface of the chip 30, while an opposite end thereof is electrically connected to the first conducting pad 32.

Since one said end of the conducting channel 33 reveals at the second surface 35 of the chip 30 and the other said end is electrically connected to the first conducting pad 32 that is electrically connected to the light-sensing elements 31, an electrical signal converted by the light-sensing elements 31 is allowed to be electrically connected to an external circuit (not shown) through the first conducting pad 32 and the conducting channel 33. That is to say, no space for wire-bonding is required on the chip 30 so that an overall volume of the packaged image sensor structure 20 can be effectively reduced.

To achieve an electrical connection between the chip 30 and the external circuit, the chip 30 may further comprise a plurality of second conducting pads (not shown). The second conducting pads may be known metal conducting pins. Alternatively, as shown in FIG. 3, the chip 30 may further comprise a plurality of conducting balls 36 which can be arranged into a ball grid array (BGA) and settled on the second surface 35 of the chip 30 while being electrically connected to the conducting channel 33 at one said end thereof revealing on the second surface 35 of the chip 30. The conducting balls 36 may be settled on the second surface 35 of the chip 30 though a conventional ball-mounting process so as to enhance a heat dissipating effect of the image sensor structure 20.

The lens module 40 comprises a holder 41 and at least one lens 42.

The holder 41 may be made of a plastic material or a metal material. The holder 41 has a through hole 411 that is settled at a center of the holder 41 and vertically passes through the entire holder 41. The holder 41 has a contact surface 412 on a bottom thereof for being combined with the first surface 34 of the chip 30 so that the lens module 40 can be directly combined with the first surface 34 of the chip 30, wherein the contact surface 412 may be combined with the first surface 34 of the chip 30 by an adhesive 43, such as an UV curable adhesive or a thermosetting adhesive.

Figure 4:
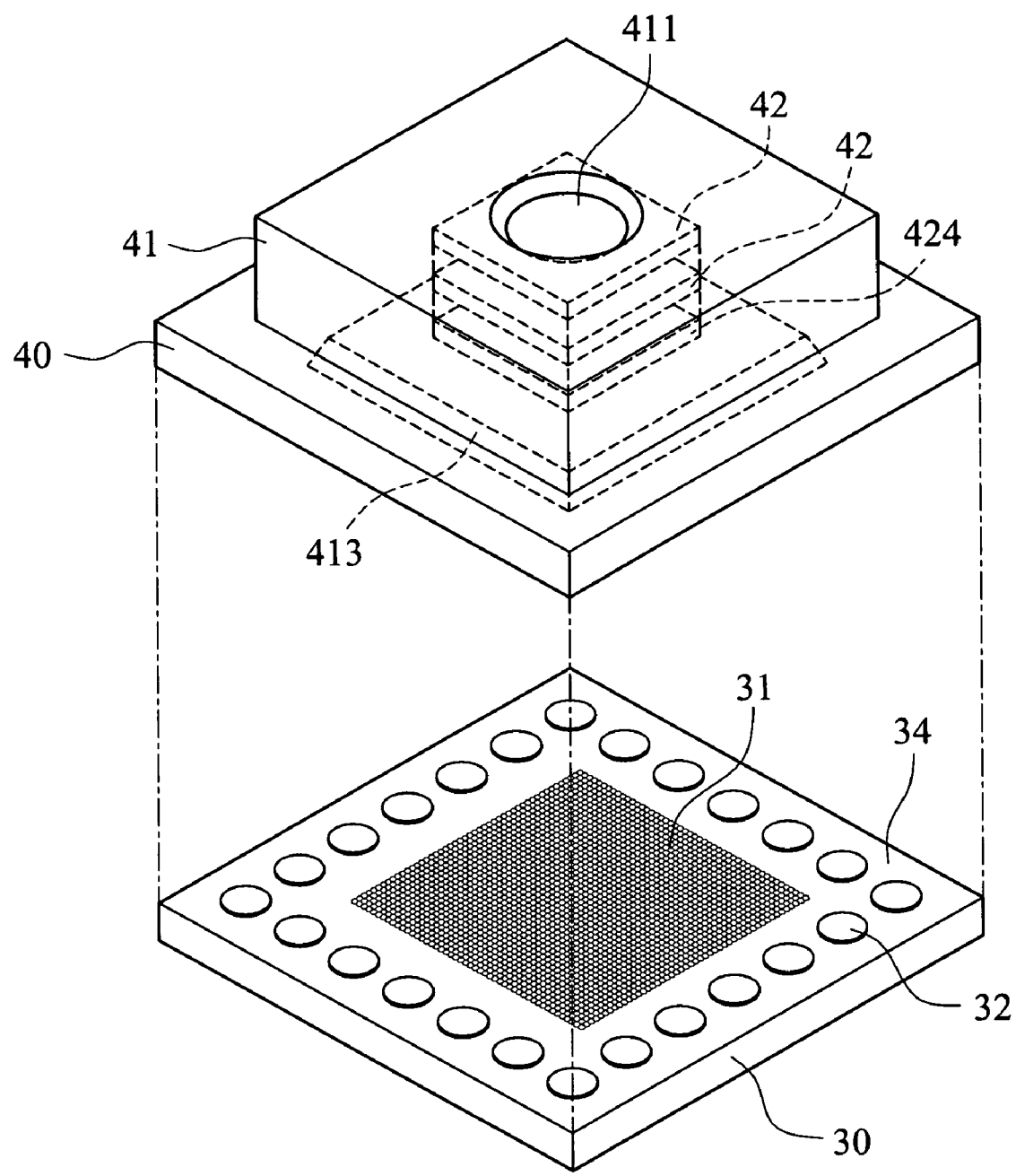
FIG. 4 is a schematic drawing illustrating an image sensor structure with an integrated lens module according to a second embodiment of the present invention.

Referring to FIG. 4, for achieving a better imaging effect of the image sensor structure 20, the lens 42 is desirably separated from the light-sensing elements 31 of the chip 30 for a proper distance. Thus, a cavity 413 may be formed at the holder 41.

As can be seen in FIG. 3, the lens 42 is embedded in the through hole 411 of the holder 41 and integrated with the holder 41. Preferably, the lens 42 is set at a predetermined position so that after the lens module 40 is assembled to the first surface 34 of the chip 30, the lens 42 allows the light entering the image sensor structure 20 to be approximately focused on the light-sensing elements 31 of the chip 30. By integrating the lens 42 and the holder 41, a manufacturing process of the image sensor structure 20 can be simplified and a manufacturing cost of the image sensor structure 20 can be reduced.

According to FIG. 3, the lens 42 may be a glass lens 421. For enhancing an image effect of the lens module 40, the glass lens 421 may be coated with an IR cut filtering layer 422 for filtering infrared rays so as to allow the image sensor structure 20 to sense images with improved accuracy.

Figure 5:
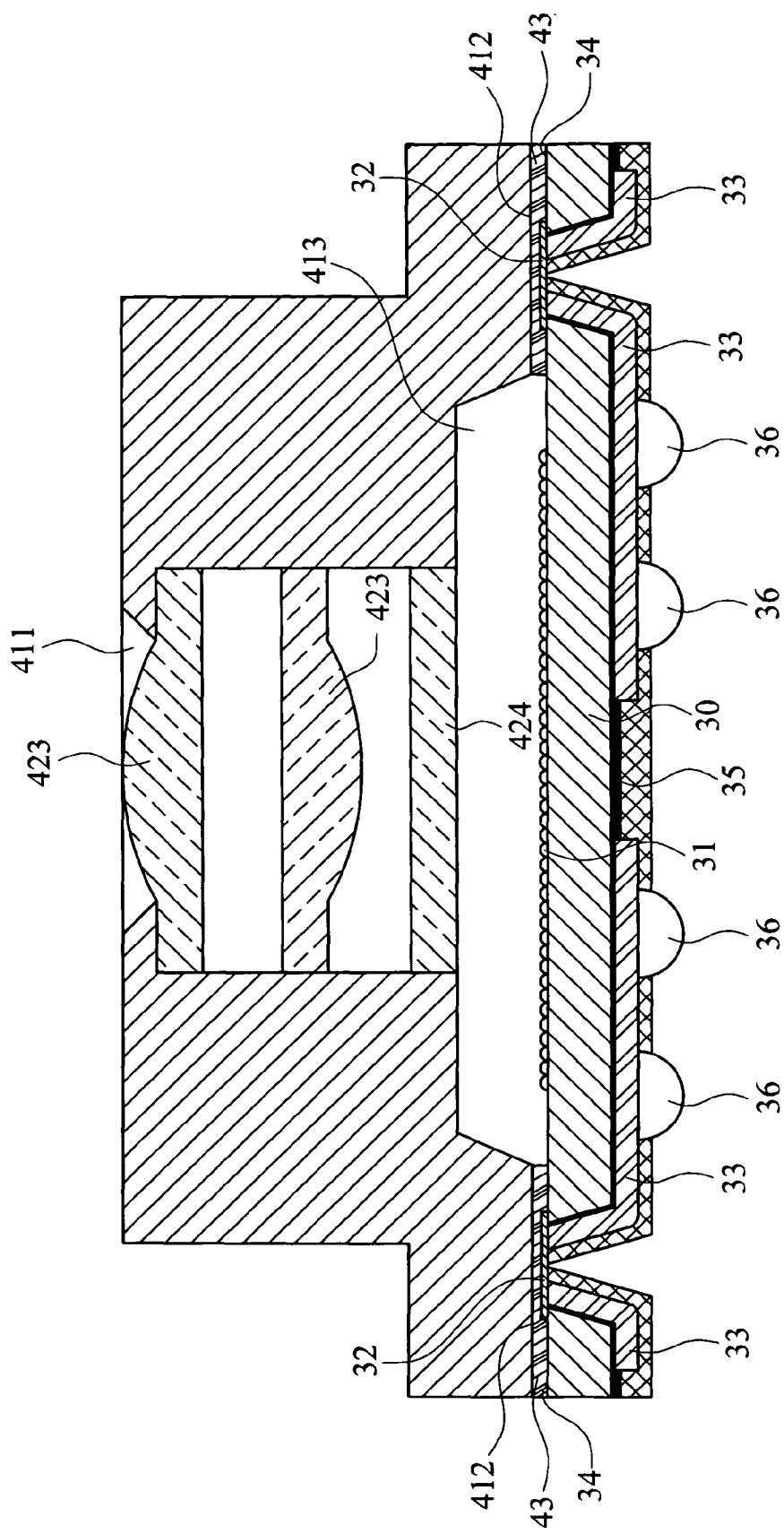
FIG. 5 is a cross-sectional view of the image sensor structure with the integrated lens module according to the second embodiment of the present invention.

Referring to FIG. 5, for lowering the manufacturing cost of the lens module 40, the lens 42 may be a plastic lens 423. Moreover, for enhancing the imaging effect of the lens module 40, an IR cut filter glass 424 may be further embedded in the through hole 411 of the holder 41 and arranged below the plastic lens 423 for filtering infrared rays.

Alternatively, the lens 42 may comprise both a glass lens 421 and a plastic lens 423. Generally, the glass lens 421 is, but not limited to be, arranged below the plastic lens 423. Similarly, for enhancing the imaging effect of the lens module 40, the glass lens 421 may be also coated with the IR cut filtering layer 422 or the IR cut filter glass 424 may be further embedded in the through hole 411 of the holder 41 and arranged below the plastic lens 423 for filtering infrared rays.

Although the particular embodiments of the invention have been described in detail for purposes of illustration, it will be understood by one of ordinary skill in the art that numerous variations will be possible to the disclosed embodiments without going outside the scope of the invention as disclosed in the claims.

What is claimed is:

1. An image sensor structure with an integrated lens module, comprising:
a chip having a plurality of light-sensing elements arranged on a light-sensing area of a first surface of the chip, a plurality of first conducting pads arranged around the light-sensing area and electrically connected to the light-sensing elements, and at least one conducting channel passing through the chip and electrically connected to the first conducting pads at one end as well as extending along with a second surface of the chip; and
a lens module comprising a holder having a through hole and a contact surface on a bottom of the holder, wherein the contact surface is combined with the first surface, and at least one lens completely embedded inside the through hole and integrated with the holder.

2. The image sensor structure as claimed in claim 1, wherein the chip is a complementary metal oxide semiconductor (CMOS) image sensor chip.

3. The image sensor structure as claimed in claim 1, wherein the chip further comprises a plurality of second conducting pads or balls which are arranged on the second surface of the chip and electrically connected to the conducting channel.

4. The image sensor structure as claimed in claim 1, wherein the chip further comprises a ball grid array which is arranged on the second surface of the chip and electrically connected to the conducting channel.

5. The image sensor structure as claimed in claim 1, wherein a cavity is formed at the bottom of the holder.

6. The image sensor structure as claimed in claim 1, wherein the holder is made of a plastic material or a metal material.

7. The image sensor structure as claimed in claim 1, wherein the contact surface is combined with the first surface by an adhesive.

8. The image sensor structure as claimed in claim 1, wherein the contact surface is combined with the first surface by an UV curable adhesive.

9. The image sensor structure as claimed in claim 1, wherein the lens is a plastic lens.

10. The image sensor structure as claimed in claim 9, which further comprises an IR cut filter glass which is embedded in the through hole and arranged below the plastic lens.

11. The image sensor structure as claimed in claim 1, wherein the lens is a glass lens.

12. The image sensor structure as claimed in claim 11, wherein the glass lens is coated with an IR cut filtering layer.

13. The image sensor structure as claimed in claim 1, wherein the lens comprises a glass lens and a plastic lens, wherein the glass lens is arranged below the plastic lens.

14. The image sensor structure as claimed in claim 13, wherein the glass lens is coated with an IR cut filtering layer.

15. The image sensor structure as claimed in claim 13, which further comprises an IR cut filter glass which is embedded in the through hole and arranged below the plastic lens.

\* \* \* \* \*